(12) United States Patent
Toriumi et al.

(10) Patent No.: US 8,163,462 B2
(45) Date of Patent: Apr. 24, 2012

(54) PHOTOSENSITIVE COMPOSITION, METHOD FOR FORMING PATTERN, AND METHOD FOR MANUFACTURING SEMICONDUCTOR DEVICE

(75) Inventors: Minoru Toriumi, Ibaraki (JP); Toshiro Itani, Ibaraki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 357 days.

(21) Appl. No.: 12/457,650

(22) Filed: Jun. 17, 2009

(65) Prior Publication Data

US 2009/0317742 A1 Dec. 24, 2009

(30) Foreign Application Priority Data

Jun. 19, 2008 (JP) .............................. 2008-160023

(51) Int. Cl.
*G02F 7/00* (2006.01)
*G03F 7/004* (2006.01)
*G03F 7/028* (2006.01)

(52) U.S. Cl. ............... 430/270.1; 430/270.15; 430/905; 430/913; 430/926

(58) Field of Classification Search ............... 430/270.1, 430/270.15, 913, 905, 926
See application file for complete search history.

(56) References Cited

U.S. PATENT DOCUMENTS

| | | | |
|---|---|---|---|
| 4,717,513 A | 1/1988 | Lewis et al. | |
| 5,030,669 A * | 7/1991 | Hendrickson et al. | 523/333 |
| 5,688,621 A * | 11/1997 | Takegawa et al. | 430/64 |
| 6,136,501 A | 10/2000 | Trefonas, III et al. | |
| 6,232,034 B1 | 5/2001 | Kasai et al. | |
| 6,306,556 B1 | 10/2001 | Matsuo et al. | |
| 6,753,129 B2 * | 6/2004 | Livesay et al. | 430/296 |
| 7,060,993 B2 * | 6/2006 | Wedowski et al. | 250/492.2 |
| 7,078,709 B2 * | 7/2006 | Herbst et al. | 250/492.2 |
| 7,479,359 B2 * | 1/2009 | Inagaki et al. | 430/59.4 |
| 7,517,629 B2 * | 4/2009 | Kobayashi et al. | 430/119.71 |
| 7,520,246 B2 * | 4/2009 | Matsuda et al. | 118/723 I |
| 7,682,762 B2 * | 3/2010 | Levy et al. | 430/59.4 |
| 7,695,752 B2 * | 4/2010 | Bonner et al. | 427/2.13 |
| 2006/0286648 A1 * | 12/2006 | Bailey et al. | 435/134 |
| 2007/0259281 A1 * | 11/2007 | Lin et al. | 430/58.8 |
| 2009/0111047 A1 * | 4/2009 | Yamashita | 430/270.1 |
| 2009/0111053 A1 * | 4/2009 | Yamashita | 430/286.1 |
| 2009/0202946 A1 * | 8/2009 | Yamashita | 430/286.1 |
| 2009/0246685 A1 * | 10/2009 | Yamashita | 430/270.1 |
| 2010/0075940 A1 * | 3/2010 | Sakamoto et al. | 514/186 |
| 2010/0167193 A1 * | 7/2010 | Nukada et al. | 430/66 |
| 2010/0248152 A1 * | 9/2010 | Scheer et al. | 430/311 |
| 2011/0013263 A1 * | 1/2011 | Miteva et al. | 359/326 |
| 2011/0159418 A1 * | 6/2011 | Sakaguchi et al. | 430/56 |
| 2011/0159420 A1 * | 6/2011 | Sakaguchi et al. | 430/69 |

FOREIGN PATENT DOCUMENTS

| | | |
|---|---|---|
| JP | 2004-62044 | 2/2004 |
| JP | 2004-219813 | 8/2004 |
| JP | 2004-530921 | 10/2004 |
| JP | 2005-508512 | 3/2005 |
| JP | 2005-213215 | 8/2005 |
| JP | 2008-107817 | 5/2008 |
| WO | 02/073308 A1 | 9/2002 |
| WO | 02/077712 A1 | 10/2002 |

OTHER PUBLICATIONS

Kim et al. (2001)"Ionization of boron, aluminum, gallium, and indium by electron impact", Physical Review A. vol. 64, 052707, pp. 1-1.
Kim et al. (2002)"Ionization of carbon, nitrogen, and oxygen by electron impact", Physical Review A. 66, 012708, pp. 1-12.
Kim et al. (1994) "Binary-encounter-dipole model for electron-impact ionization", Physical Review A, vol. 50(5), pp. 3954-3967.

* cited by examiner

*Primary Examiner* — Amanda C. Walke
(74) *Attorney, Agent, or Firm* — McGinn IP Law Group, PLLC

(57) ABSTRACT

The present invention relates to a photosensitive composition, which is capable of being irradiated with high energy beam having a wave length of 1 to 300 nm band. The photosensitive composition includes a binder resin; and a photoelectron absorbent, capable of being excited with photoelectron emitted from the binder resin that absorbs the high energy beam, when the binder resin is irradiated with the high energy beam.

20 Claims, No Drawings

PHOTOSENSITIVE COMPOSITION, METHOD FOR FORMING PATTERN, AND METHOD FOR MANUFACTURING SEMICONDUCTOR DEVICE

This application is based on Japanese patent application No. 2008-160023, the content of which is incorporated hereinto by reference.

BACKGROUND

1. Technical Field

The present invention relates to a photosensitive composition, a method for forming pattern, and a method for manufacturing a semiconductor device.

2. Related Art

A lithographic technology is employed as a technology for manufacturing a semiconductor element. A chemically amplified photoresist having a characteristic of higher sensibility is employed in the lithographic technology.

The chemically amplified photoresist contains materials of a binder prepared by introducing a protective group in a base resin, which is soluble to a liquid developer, to reduce the solubility of the resin, and a photosensitive composition composed of a photo-acid generator for generating acid by an irradiation of a high energy ray and the like.

In the lithographic technology employing the chemically amplified photoresist, acid is generated from a photo-acid generator by exposing to light, and protective group causes a deprotection reaction by heating. The binder resin is deprotected to change the solubility to a liquid developer to be soluble. This allows a photoresist being soluble in a liquid developer, achieving a pattern formation.

The increased level of the recent LSI integration accelerates the miniaturization of the electronic circuit, and a formation of pattern features smaller than 50 nm is required. This causes a reduced wave length of light utilized for exposure from 248 nm of krypton fluoride (KrF) excimer laser, through 193 nm of argon fluoride (ArF) excimer laser, to 13.5 nm of extreme ultraviolet (EUV). The wave length 13.5 nm of such light source is shorter by one tenth or smaller than the wave length of the ArF excimer laser, which is currently employed for a light source in the commercial production, and thus higher resolution is expected.

A use of a photosensitive composition, namely a photoresist, is also required as a material for creating patterns in the EUV lithography, and a use of a chemically amplified photoresist is considered due to its higher sensitivity.

In order to achieve a production of a semiconductor element with higher performance, a higher resolution in lithography and reduced surface roughness on the side wall of the photoresist pattern are required. For example, large roughness on the side wall of the pattern causes an irregularity on the side wall (so-called "line edge roughness") from an upper viewpoint. Such line edge roughness is transferred during an etching process for a workpiece to deteriorate a dimensional controllability, and reduces the production yield. Therefore, a lithographic technology with improved resolution and reduced line edge roughness is requested.

Currently, various types of lithographic technologies employing high energy beam as statement above are proposed (for example, Japanese Patent Laid-Open No. 2004-062,044, Japanese Patent Laid-Open No. 2004-219,813, Japanese Patent Laid-Open No. 2005-213,215, Japanese Patent Laid-Open No. 2008-107,817, Japanese Patent National Publication No. 2004-530,921, and Japanese Patent National Publication No. 2005-508,512).

However, the conventional technologies described in the above-described patent publications contains the following problems to be improved.

First of all, there is a room for improvement in view of the resolution. For example, when a photoresist is exposed to a high energy beam such as an EUV radiation, energy of a photon is larger than the ionization energy for the photoresist material. Therefore, atom composing the photoresist material is brought into highly excited state with the EUV radiation to be ionized. Since the photoelectron generated by such ionization process is in higher energy state, the photoelectron travels from the location where the EUV radiation is absorbed and scatters through the photoresist, and then is reached to a thermal equilibration, and after that, is reacted with a photo-acid generator to generate an acid. The distance for travelling electron is considered as about 5 nm. In other words, additional travelling of about several nanometer is required for attaining a thermal equilibrium for photoelectron, as compared with the conventional lithography, so that the resolution for the photoresist is reduced, causing a problem of increased roughness on the side wall of the photoresist pattern.

Secondly, there is a room for improvement in view of sensibility. Since the energy of photon in the EUV radiation is larger, less photons incident to the photoresist are required to achieve an exposure with the same sensibility as employed for the conventional photoresist. Thus, problems in deficient sensibility is caused, in which the amount of light for the exposure is not sufficient for inducing the reaction similarly as in the case of employing the conventional photoresist.

Improvements in the resolution and the sensibility are common targets in not only the EUV lithography but also the lithography employing high energy beam.

SUMMARY

According to one aspect of the present invention, there is provided a photosensitive composition, which is capable of being irradiated with high energy beam having a wave length of 1 to 300 nm band, comprising: a binder resin; and a photoelectron absorbent, capable of being excited with photoelectron emitted from the binder resin that absorbs the high energy beam, when the binder resin is irradiated with the high energy beam.

According to another aspect of the present invention, there is provided a method for forming a pattern, including: forming a photoresist film on a substrate employing a photoresist material containing the above-described photosensitive composition; exposing the photoresist film to high energy beam having a wave length of 1 to 300 nm band; and developing the exposed photoresist film.

According to further aspect of the present invention, there is provided a method for manufacturing a semiconductor element including a lithographic operation, wherein the lithography operation includes: forming a photoresist film on a substrate employing a photoresist material containing the above-described photosensitive composition; and exposing the photoresist film to high energy beam having a wave length of 1 to 300 nm band.

According to the present invention, the photoelectron absorbent, which is capable of being excited with photoelectron emitted from the binder resin that absorbs the high energy beam having a wave length of 1 to 300 nm band, is provided in the photoresist material to form the photoresist film containing the photoelectron absorbent in the substrate. This allows photoelectron emitted from the binder resin by an irradiation of the high energy beam excites the photoelectron absorbent, so that secondary electron is emitted. Secondary electron in such case is thermally-equilibrated in a short distance since secondary electron in such case is in the lower energy level, unlikely as in the case of photoelectron in the higher energy level. Therefore, a deterioration in the resolution due to moving of photoelectron for longer distance, which was a problem in the conventional technology, can be reduced. Further, the decreased traveling distance of electron means an increased energy per unit area of the photoresist induced by the irradiation of photoelectron. Therefore, the reaction amount per unit area is increased, achieving highly sensitive photoresist. Thus, the patterned photoresist can be formed with enhanced resolution and sensibility.

According to the present invention, the patterned photoresist can be formed with enhanced resolution and sensibility, semiconductor elements with increased integration can be manufactured with increased productivity.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments of the present invention will be described hereinafter. The present embodiment is related to a photosensitive composition, which is capable of being irradiated with high energy beam having a wave length of 1 to 300 nm band. The photosensitive composition includes a binder resin and a photoelectron absorbent, which is capable of being excited with photoelectron emitted from the binder resin that absorbs the high energy beam, when the binder resin is irradiated with the high energy beam.

The high energy beam employed in the present embodiment may have a wave length of 1 to 300 nm band, and may preferably have a wave length of 1 to 100 nm band. More specifically, krypton-fluoride (KrF) excimer-laser, argon-fluoride (ArF) excimer-laser, fluorine ($F_2$) excimer-laser, X-ray, extreme ultraviolet (EUV) ray may be utilized. EUV radiation and X-ray may be preferably employed in the present embodiment, and EUV radiation may be more preferably employed. The wave length of EUV radiation may be selected to 13.5 nm to provide a practical use.

In the present embodiment, the term "excited with photoelectron" means that photoelectron bombards the photoelectron absorbent to strike outer shell electrons of atom constituting the photoelectron absorbent out, and then some of electrons exceed the bound energy of the photoelectron absorbent to cause an emission of secondary electron from the surface of the photoelectron absorbent.

The photosensitive composition of the present embodiment includes, more specifically: (A) a photoelectron absorbent; (B) a binder resin; (C) a photo-acid generator; (D) an acid diffusion-control agent; and (E) an adhesive auxiliary. Descriptions will be made on each of the components.

(A) Photoelectron Absorbent

The photoelectron absorbent has metallic element having higher excitation cross section and ionization energy for photoelectron released from the binder resin, as compared with a compound constituting the binder resin (hereinafter referred to as resin compound).

Energy of EUV radiation having a wave length of 13.5 nm is 92 eV and ionization energy of the photoresist material is about 10 eV, so that photoelectron of about 82 eV is emitted from the binder resin that is irradiated with EUV radiation. Therefore, it is preferable for the photoelectron absorbent to select metallic element, which has ionization energy of lower than 82 eV around 82 eV and the incidence energy of such element around 82 eV effectively excites electron.

More specifically, such type of the photoelectron absorbent is excited with photoelectron of about 82 eV with enhanced efficiency to emit secondary electron. Secondary electron in such case is thermally-equilibrated in a short distance since secondary electron in such case is in the lower energy level, unlikely as in the case of photoelectron in the higher energy level. Therefore, a blur effect due to traveling of photoelectron for longer distance, which was a problem in the conventional technology, can be reduced to achieve enhanced resolution and decreased roughness on the side wall.

A suitable metallic element having a mass extinction coefficient that is not excessively larger as compared with the mass extinction coefficients of resin compounds may be arbitrarily selected for the metallic element contained in the photoelectron absorbent. Excessively larger mass extinction coefficient provides an increased absorbance of the photoresist, such that high energy beam cannot be reached to the deeper section of the photoresist. Therefore, this deteriorates the dimensional control, and thus is not preferable.

More specifically, the photoelectron absorbent (A) may contain a metallic element having a ratio of reaction cross-sectional area [$\times 10^{-2}$ nm] for photoelectron emitted from the binder resin irradiated with EUV radiation as the high energy beam, with mass absorption coefficient [$\times 10^4$ $cm^2/g$] for the EUV radiation, of 0.8 or higher. In this case, the incidence energy of photoelectron emitted from the binder resin (B) may be set to 82.5 eV. More specifically, metallic element contained in the photoelectron absorbent (A) exhibiting the ratio of the reaction cross-sectional area [$\times 10^{-2}$ nm] for photoelectron of 82.5 eV when EUV radiation of a wave length of 13.5 nm is applied with the mass absorption coefficient [$\times 10^4$ $cm^2/g$] for EUV radiation of a wave length of 13.5 nm, of 0.8 or higher, may be employed. While higher value of such ratio is preferable, the ratio may be 2.0 or lower, in view of practicality.

As discussed in detail later, a resin compound is mainly composed of hydrogen, carbon and oxygen, and the ratios of the reaction cross-sectional area [$\times 10^{-2}$ nm] for photoelectron of the incidence energy of 82.5 eV with the mass absorption coefficient [$\times 10^4$ $cm^2/g$] for high energy beam of wave length of 13.5 nm are: 0.39 (hydrogen), 0.79 (carbon), and 0.15 (oxygen), respectively (Y. K. Kim and M. E. Rudd, Phys. Rev. A 50, 3954 to 3967 (1994), Y. K. Kim and J. P. Desclaux, Phys. Rev. A 66, 12708 (2002)). Therefore, metallic element having the ratio of the reaction cross-sectional area [$\times 10^{-2}$ nm] for photoelectron of the incidence energy of 82.5 eV with the mass absorption coefficient [$\times 10^4$ $cm^2/g$] for high energy beam of wave length of 13.5 nm, of 0.8 or higher, is employed, so that suitable metallic element having higher excitation cross section and higher ionization energy as compared with the resin compounds, and having a mass extinction coefficient that is not excessively larger as compared with the mass extinction coefficients of resin compounds, can be selected.

More specifically, atomic absorption is dominant for light having the wave length of EUV radiation, rather than the molecular absorption of the compound. Therefore, the ratio of the reaction cross-sectional area [$\times 10^{-2}$ nm] for photoelectron emitted from the binder resin irradiated with EUV radiation with the mass absorption coefficient [$\times 10^4$ $cm^2/g$] for EUV radiation, of 0.8 or higher, is employed for the metallic element, so that suitable metallic element having higher excitation cross section and higher ionization energy as compared with the resin compounds, and having a mass extinction coefficient that is not excessively larger as compared with the mass extinction coefficients of resin compounds, can be selected.

Typical metallic element contained in the photoelectron absorbent includes, gallium or indium. The ratios of the reaction cross-sectional area [$\times 10^{-2}$ nm] for photoelectron of the incidence energy of 82.5 eV with the mass absorption coefficient [$\times 10^4$ cm$^2$/g] for high energy beam of wave length of 13.5 nm are: 1.43 for gallium; and 1.18 for indium (Y. K. Kim and P. M. Stone, Phys. Rev. A64, 52707 (2001)).

Gallium atom has the larger ionization and excitation cross section for electron of 82 eV by 3.8 times than carbon atom (gallium atom: Y. K. Kim and P. M. Stone, Phys. Rev. A 64, 052707 (2001), carbon atom: Y. K. Kim and J. P. Desclaux, Phys. Rev. A 66, 012708 (2002)). More specifically, the reactivity of gallium atom is larger by four times than the reactivity of carbon atom, and as a result, a thermal-equilibration is caused with higher efficiency to provide reduced distance of electron traveling within the photoresist from the location where EUV radiation is absorbed.

In addition, the mass extinction coefficient of gallium atom for EUV radiation of 13.5 nm is larger by only about twice than that of carbon atom, and is smaller by 25% than that of oxygen atom. Therefore, smaller absorbance of the photoresist for EUV radiation can be maintained. Since EUV radiation can reach to the deeper part of the photoresist in the case of smaller absorbance of the photoresist, the photoresist material exhibiting improved dimensional controllability and having rectangular cross-section after the exposure/development can be designed.

Since indium is a heavy element, the use of indium is advantageous for reduced path length of electron beam by the heavy atom effect.

More specifically, an inorganic compound containing gallium or indium an organometallic compound containing gallium or indium or a metallic complex containing gallium or indium may be employed for the photoelectron absorbent.

Typical inorganic compound containing gallium available for the photoelectron absorbent includes a gallium salt such as gallium halide and the like, or a gallium oxide. Preferable gallium halide includes gallium bromide, gallium iodide or the like. In addition, typical gallium salt other than gallium halide includes, for example, gallium sulfate.

Typical organometallic compound containing gallium available for the photoelectron absorbent includes an alkyl gallium such as trimethylgallium and the like and an allyl gallium such as triphenyl gallium and the like. In addition, an acetonato salt such as gallium acetylacetonato and the like or an organic acid salt such as gallium oxalate and the like may be employed.

The following organogallium compound (1) may alternatively be employed for the photoelectron absorbent (A).

(Formula 1)

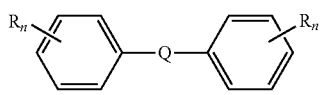

(1)

In Formula (1), Q is hydrocarbon residue containing gallium. R is: (a) fluorine, chlorine, bromine or the like; (b) saturated hydrocarbon group such as, for example, alkyl, cycloalkyl or the like; (c) unsaturated hydrocarbon group such as, for example, vinyl, alkenyl; (d) aromatic hydrocarbon group such as, for example, aryl or the like; (e) halogenated saturated hydrocarbon group such as, for example, alkyl chloride, alkyl fluoride or the like; (f) halogenated aromatic hydrocarbon group such as, for example, aryl chloride or the like; (g) halogenated unsaturated hydrocarbon group such as, for example, vinyl chloride, vinyl fluoride or the like; or (h) Silicon containing hydrocarbon group such as, for example, alkyl silyl or the like. Specific example of preferable R includes methyl, ethyl, propyl, i-propyl, n-butyl, i-butyl, t-butyl, n-amyl, i-amyl, n-hexyl, cyclopropyl, cyclopentyl, allyl, phenyl, benzil, 1-naphthyl, 2-naphthyl, trimethylsilyl, trifluoromethyl, pentafluorophenyl or the like. "n" represents integer number of 0 to 5, independent for the elements.

The metallic complex having gallium (gallium complex) may be formed by reacting metallic gallium or gallium compound with ligand. Typical gallium complex that can be used as the photoelectron absorbent includes gallium chloride-naphthalocyanine, gallium chloride-phthalocyanine, tris(8-hydroxy quinolinato)gallium, triethylgallium amine-addition product, bis(dialkyl-μ-amide-gallium), bis[dimethyl(1,1-dimethyl hydrazide)gallium] and the like.

In addition, an organogallium compound (2) disclosed in Japanese Patent Laid-Open No. H05-148,274 may be employed for the gallium complex.

(formula 2)

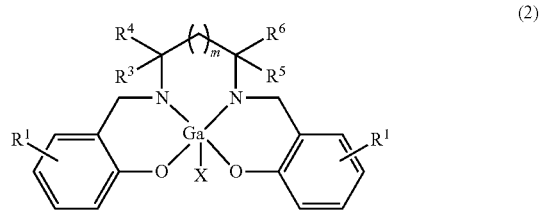

(2)

In formula (2), X is $O_2CR^2$, halogen, $NO_3$ or —O-A; $R^1$ is hydrogen, alkyl, alkoxy, halogen, $NO_2$ or amino; $R^2$ is alkyl, alkoxy or aryl; each of $R^3$, $R^4$, $R^5$ and $R^6$ is hydrogen or alkyl; m is 0, 1 or 2, or m is 0; and, when both of $R^3$ and $R^6$ are hydrogen, $R^4$ and $R^5$ may be combined to create tetramethylene; and A is an equivalence of gallium complex component, to which atomic oxygen is bound.

The substituted compounds of the above-described gallium-containing inorganic compound, organometallic compound or metallic complex, which substitute gallium with indium, may be employed.

In addition to above, the above-described compounds are for the illustration only, and any arbitrary compound having gallium or indium may be employed for the photoelectron absorbent, unless the compound is harmful for the function as the photoresist material.

(B) Binder Resin

The compound for the binder resin (B) is not particularly limited, as long as the compound has acidic dissociation group bound to a resin (B0) that is soluble with an alkali liquid developer.

The resin (B0) for being bound with acidic dissociation group may be a resin having functional group exhibiting affinity with an alkali liquid developer, or more specifically having acidic functional group such as, for example, phenolic hydroxy group, carboxyl group and the like. The preferable resin (B0) may be a resin having at least one repetitive unit selected from, for example, repetitive unit presented by the following formula (3), repetitive unit presented by the following formula (4) and repetitive unit presented by the following formula (5).

(formula 3)

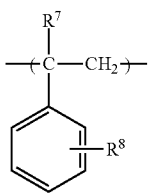

(formula 4)

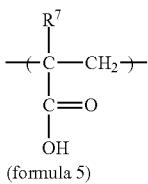

(formula 5)

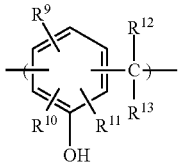

In addition to above, in formula (3) and formula (4), $R^7$ is hydrogen (H) or methyl group, $R^8$ is hydroxyl group, carboxyl group, —$R^9$COOH, —$O^9$COOH or —OCOR$^9$COOH, and $R^9$ is —$(CH_2)n_1$-, and $n_1$ is an integer number of 1 to 4.

In addition, in formula (5), $R^9$, $R^{10}$, $R^{11}$, $R^{12}$ and $R^{13}$ are, the same or different, hydrogen (H) or alkyl group of C1 to C4.

The resin (B0) may be constituted with only repetitive units represented by formula (3), formula (4) or formula (5), or may have other repetitive unit. Typical example of "other repetitive unit" includes repetitive units created by breaking double bond of monomer having double bond, such as, for example, maleic anhydride, fumaronitrile, acrylamide, acrylonitrile, vinylpyridine, vinylpyrrolidone, vinylimidazole, vinyl aniline and the like.

The content of repetitive units represented by formula (3), formula (4) or formula (5) in the above-described resin (B0) may be ordinarily equal to or higher than 15% mol., and preferably equal to or higher than 20% mol. Molecular weight of the resin of the present invention (B0) may be preferably 1,000 to 150,000 for polystyrene-converted weight average molecular weight measured with gel permeation chromatography (GPC), and more preferably 3,000 to 100,000.

The binder resin (B) is an alkali-insoluble resin or an alkali-hardly-soluble resin, which is created by substituting hydrogen (H) in phenolic hydroxy group or carboxyl group of acidic functional group in the above described resin (B0) with at least one acidic dissociation group selected from the group consisting of methyl group, mono-substituted ethyl group, germyl group, alkoxycarbonyl group and acyl group. In such case, the acidic dissociation group means a functional group that is capable of being dissociated in the presence of acid, and serves as so-called protective group.

Specific examples of the protective group include: substituted methyl group such as methoxymethyl group, methylthiomethyl group, methoxyethoxymethyl group, tetrahydropyranyl group, tetrahydrofuranyl group, tetrahydro thiofuranyl group, tetrahydro thiopyranyl group, benzyloxymethyl group, phenacyl group, bromophenacyl group, methoxy phenacyl group, α-methyl phenacyl group, cyclopropylmethyl group, cyclohexyl group, cyclopentyl group, benzyl group, triphenylmethyl group, diphenylmethyl group, bromobenzyl group, nitrobenzyl group, methoxybenzyl group, piperonyl group and the like; mono-substituted ethyl group such as 1-methoxyethyl group, 1-ethoxyethyl group, isopropyl group, t-butyl group, 1,1-dimethylpropyl group and the like; germyl group such as trimethyl germyl group, triethyl germyl group, t-butyl dimethyl germyl group, isopropyl dimethyl germyl group, phenyl dimethyl germyl group and the like; alkoxycarbonyl group such as methoxycarbonyl group, ethoxycarbonyl group, t-butoxycarbonyl group and the like; and acyl group such as acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacrylic group, crotonoyl group, oleoyl group, maleoyl group, fumaroyl group, mesaconoyl group, camphoroyl group, benzoyl group, phthaloyl group, isophthaloyl group, terephthaloyl group, naphthoyl group, toluoyl group, hydratropoyl group, atropoyl group, cinnamoyl group, furoyl group, thenoyl group, nicotinoyl group, isonicotinoyl group, p-tosyl group, p-toluenesulfonyl group, mesyl group, and the like.

Among these, t-butyl group, benzyl group, tetrahydrofuranyl group, tetrahydropyranyl group, tetrahydrothiofuranyl group, tetrahydro thio pyranyl group, and t-butoxycarbonyl group are preferable.

Introduction of the above-described protective group is achieved via photoacid group of the resin (B0), and the amount of the protective group introduced to the resin may be preferably 15 to 100% over the whole amount of acidic functional group in the resin (B0), and more preferably 30 to 100%. The molecular weight of the resin (A) analyzed by GPC is preferably 1,000 to 150,000, and were preferably 3,000 to 100,000.

(C) Photo-Acid Generator

The photo-acid generator is capable of generating acid by an irradiation with high energy beam. Typical photo-acid generator (C) includes, for example, onium compounds such as diaryliodonium salt, triaryl sulfonium salt, phenyl diazonium salt and the like, imide sulfonate derivatives, tosylate compounds, carbonate compounds of benzil derivatives and halides of triazine derivatives.

The above-described diaryliodonium salt is represented by formula (6).

(formula 6)

$$Ar_2I^+Y^- \qquad (6)$$

In formula (6), "Ar" represents aryl group, and Y represents anion.

Typical cation ($Ar_2I^+$) in diaryliodonium salt represented by formula (6) includes, for example, diphenyliodonium, 4-methoxyphenyl-phenyl iodonium, bis(4-methoxyphenyl) iodonium and bis(4-t-butylphenyl)iodonium and the like.

Besides, typical anion ($Y^-$) includes, for example: naphthalene derivatives such as naphthalene-1-sulfonate, naphthalene-2-sulfonate, 2-t-butyl-naphthalene-2-sulfonate and the like; anthracene derivatives such as anthracene-1-sulfonate, anthracene-2-sulfonate, 9-nitroanthracene-1-sulfonate, 5,6-dichloroanthracene-3-sulfonate, 9,10-dichloroanthracene-2-sulfonate, 9,10-dimethoxy anthracene-2- sulfonate, 9,10-diethoxy anthracene-2-sulfonate, benz (a) anthracene-4-sulfonate and the like; anions having other type of polycyclic structures such as phenanthrene-2-sulfonate, pyrene-sulfonate, triphenylene-2-sulfonate, chrysene-2-sulfonate, anthraquinone-sulfonate and the like; trifluoromethane sulfonate; hexafluoro antimonate; tetrafluoroborate; hexafluoro phosphate; benzene sulfonate and the like, and among these, anthracene derivatives and trifluoromethane sulfonate are preferable.

Triaryl sulfonium salt is represented by formula (7).

(formula 7)

$$Ar_3S^+Y^- \qquad (7)$$

In formula (7), "Ar" represents aryl group, and Y represents anion.

Typical cation ($Ar_3S^+$) in triaryl sulfonium salt represented by formula (7) includes, for example, triphenyl sulfonium, methoxyphenyl-diphenyl sulfonium, bis(methoxyphenyl)-phenyl sulfonium, tris(methoxyphenyl)sulfonium, 4-methylphenyl-diphenyl sulfonium, 2,4,6-trimethylphenyl-diphenyl sulfonium, 4-t-butylphenyl-diphenyl sulfonium, tris(4-t-butylphenyl)-sulfonium the like. Further, specific examples of anion (Y—) are the same as previously exemplified in the description for diaryliodonium salt.

Typical imide sulfonate derivative includes, for example, trifluoromethyl sulfonyloxybicyclo[2.2.1]-hept-5-ene-dicarboximide, succinimide trifluoromethyl sulfonate, phthalimide trifluoromethyl sulfonate and the like. Typical tosylate compounds include, for example, benzyl cation derivatives such as benzyl tosylate, nitrobenzyl tosylate, dinitrobenzyl tosylate and the like.

Further, typical carbonate compounds of benzil derivatives include, for example, benzil carbonate derivatives such as benzil carbonate, nitrobenzyl carbonate, dinitrobenzyl carbonate and the like. Typical halides of the triazine derivatives include, for example, trichloromethyl triazine derivatives such as 2,4,6-(tris chloromethyl)-s-triazine and the like.

The amount of the employed photo-acid generator (C) may be 0.5 to 30 parts by weight (pbw) over 100 parts by weight of the binder resin (B), and preferably 5 to 25 pbw, and particularly preferably 10 to 20 pbw. Excessively lower amount of the photo-acid generator may cause insufficient deprotection reaction by the exposure, resulting in insufficient dissolution of the formed pattern in the development process. Conversely, excessively larger amount of the photo-acid generators may cause unwanted progress of the deprotection reaction when the ratio of the exposed portions is smaller as in the background level, resulting in failing the formation of the pattern.

One photo-acid generator (C) may be employed alone, or two or more photo-acid generator (C) may be employed.

(D) Acid Diffusion-Control Agent

The acid diffusion-control agent serves as controlling a diffusion of acid generated from the photo-acid generator by the exposure in the photoresist coating film to inhibit unwanted chemical reaction in the unexposed regions. The use of such acid diffusion-control agent provides an improved storage stability of the photoresist composition and improved resolution, and also provides inhibition for the change in the line width of the patterned photoresist due to the variations in the pre-exposure time delay and the post exposure time delay (PED), providing extremely enhanced process stability.

Typical acid diffusion-control agent (D) includes atomic nitrogen-containing basic compounds, or basic compounds degradable with electron beam radiation, such as basic sulfonium compounds, basic iodonium compounds and the like.

Typical atomic nitrogen-containing basic compound includes, for example, compounds represented by formula (8), amide-containing compounds, urea compounds, nitrogen-containing heterocyclic compounds and the like.

(formula 8)

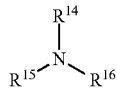

(8)

The compound represented by formula (8) (hereinafter, referred to as "nitrogen-containing compound (I)") ($R^{14}$, $R^{15}$ and $R^{16}$ are independency hydrogen (H), alkyl group, and aryl group, and hydrogen (H) in alkyl group and aryl group may be substituted with functional group such as hydroxy group) may be diamino compounds having two nitrogen (N) in one molecule (hereinafter, referred to as "nitrogen-containing compound (II)"), or diamino polymer having 3 or more nitrogen (N) (hereinafter, referred to as "nitrogen-containing compound (III)").

Typical nitrogen-containing compound (I) includes, for example: trialkyl amines such as triethylamine, tri-n-propyl amine, tri-n-butyl amine, tri-n-pentylamine, tri-n-hexylamine, tri-n-heptyl amine, tri-n-octyl amine, tri-n-nonyl amine, tri-n-decyl amine, triethanolamine, dimethyl-n-dodecylamine and dicyclohexyl methylamine; and aromatic amines such as aniline, N-methylaniline, N,N-dimethylaniline, 2-methylaniline, 3-methylaniline, 4-methylaniline, 4-nitroaniline, diphenylamine, triphenyl amine and 1-naphthylamine.

Typical nitrogen-containing compound (II) includes, for example: diaminoethane, N,N,N',N'-tetramethylethylenediamine, N,N,N',N'-tetrakis(2-hydroxypropyl)diaminoethane, tetramethylenediamine, hexamethylene diamine, 4,4'-diaminodiphenyl methane, 4,4'-diaminodiphenyl ether, 4,4'-diamino benzophenone, 4,4'-diamino diphenylamine, 2,2-bis (4'-aminophenyl)propane, 2-(3'-aminophenyl)-2-(4'-aminophenyl)propane, 2-(4'-aminophenyl)-2-(3'-hydroxyphenyl)propane, 2-(4'-aminophenyl)-2-(4'-hydroxyphenyl)propane, 1,4-bis[1'-(4''-aminophenyl)-1'-methylethyl]benzene and 1,3-bis[1'-(4''-aminophenyl)-1'-methylethyl]benzene and the like.

Typical nitrogen-containing compound (III) includes, for example: polymers of polyethylene imine, polyallylamine, dimethylaminoethyl acrylamide and the like. Typical amide group-containing compound includes, for example, formamide, N-methylformamide, N,N-dimethylformamide, acetamide, N-methylacetamide, N,N-dimethylacetamide, propionamide, benzamide, pyrrolidone and N-methylpyrrolidone and the like. Typical urea compound includes, for example, urea, methyl urea, 1,1-dimethylurea, 1,3-dimethylurea, 1,1,3,3-tetramethyl urea, 1,3-diphenyl urea, tri-n-butylthio urea and the like.

Typical nitrogen-containing heterocyclic compound includes, for example: imidazoles such as imidazole, benzimidazole, 4-methyl imidazole, 4-methyl-2-phenylimidazole, 2-phenyl benzimidazole; pyridines such as pyridine, 2-methylpyridine, 4-methylpyridine, 2-ethylpyridine, 4-ethylpyridine, 2-phenyl pyridine, 4-phenyl pyridine, 2-methyl-4-phenyl pyridine, 2,2,2-tri pyridine, nicotine, nicotinic acid, nicotinamide, quinoline, 8-oxyquinoline, acridine; and in addition, pyrazine, pyrazole, pyridazine, quinozaline, purine, pyrrolidine, piperidine, morpholine, 4-methylmorpholine, piperazine, 1,4-dimethylpiperazine, 1,4-diazabicyclo[2.2.2]octane and the like.

The blending ratio of the acid diffusion-control agent (D) per 100 pbw of the resin (B) may be preferably 0.001 to 30 pbw, more preferably 0.01 to 20 pbw, and further preferably 1 to 15 pbw. In this case, the blending ratio of the acid diffusion-control agent of lower than 0.001 pbw may tend to cause degradation of the resolution, deteriorations in the pattern geometry and dimension fidelity or the like, according to the process conditions, and may further tend to cause a deterioration in the pattern geometry in the upper layer of the pattern when a light thermal processing called post exposure bake (PEB) is conducted for longer duration time. On the other hand, the blending ratio of the acid diffusion-control agent of higher than 30 pbw may tend to cause degradations in the sensitivity of the photoresist and developing-ability of the portions without exposure.

(E) Adhesive Auxiliary

The adhesive auxiliary (E) allows the photosensitive composition having improved adhesiveness. Typical examples of such adhesive auxiliary preferably include silane compounds having reactive substitutional group such as carboxyl group, methacryloyl group, isocyanate group, epoxy group and the like (functionalized silane coupling agent).

Specific examples of the functionalized silane coupling agent include trimethoxysilylbenzoic acid, γ-methacryloxy propyl trimethoxysilane, vinyl triacetoxy silane, vinyl trimethoxysilane, γ-isocyanate propyl triethoxysilane, γ-glycidoxypropyltrimethoxysilane, β-(3,4-epoxy cyclohexyl)ethyl trimethoxysilane and the like. The ratio of using the adhesive auxiliary may be equal to or lower than 20 pbw over 100 pbw of the resin (B) component, and preferably 0.05 to 10 pbw, and particularly preferably 1 to 10 pbw.

In addition to above, the photo-acid generator and/or the adhesive auxiliary may be added to the photosensitive composition to provide improved sensitivity and adhesiveness of the photoresist.

Other components such as surfactant, sensitizer, dissolution promoter or the like, which are employed in the photosensitive composition of the present embodiment as needed, may be dissolved in a solvent so as to set the solid content concentration of, for example, 5 to 40 wt %. Then, the solvent is filtered with a filter with openings of about 0.2 μm to prepare a resist material.

Typical solvent includes, for example, ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, propylene glycol methyl ether acetate, propylene glycol propyl ether acetate, propylene glycol methyl ether propionate, toluene, xylene, butanone, 2-heptanone, 3-heptanone, 4-heptanone, cyclohexanone, ethyl 2-hydroxy propionate, ethyl 2-hydroxy-2-methyl propionate, methyl 2-methoxy-2-methyl propionate, ethoxy ethyl acetate, hydroxy ethyl acetate, methyl 2-hydroxy-3-methyl butanoate, methyl 3-methoxy propionate, ethyl 3-methoxy propanoate, ethyl 3-ethoxy propionate, ethyl acetate, butyl acetate, methyl pyruvate, ethyl pyruvate, methyl lactate, ethyl lactate, propy lactate and the like. Further, a high-boiling solvent such as N-methylformamide, N,N-dimethylformamide, N-methyl formanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, ethylene glycol monophenyl ether acetate or the like may be added to these solvents. Each of these solvents may be employed alone, or combinations of two or more of these solvents may be employed.

A process for forming a pattern in the semiconductor substrate by employing the prepared photoresist material will be described as follows. Such process for forming a pattern includes: forming a photoresist film on a semiconductor substrate; exposing the photoresist film to high energy beam having a wave length of 1 to 300 nm band; and developing the exposed resist film.

More specifically, the process includes: (a) coating a workpiece with a photoresist material containing a photosensitive composition of the present embodiment to form a photoresist film; (b) exposing the formed photoresist film to light; and (c) developing the exposed photoresist film to obtain a desired pattern.

Typical operation (a) for applying the material includes coating a substrate of, for example, a silicon wafer or a wafer having a coating of aluminum with the photosensitive composition via a spin coating process, a cast coating process, a roll coating process or the like, and then pre-baking the coated substrate to form a photoresist coating film.

Typical operation (b) for exposing the formed photoresist film to light includes irradiating the photoresist coating film with radioactive ray and heating thereof so as to form a desired patterned photoresist (hereinafter referred to as "post exposure bake"). The thermal condition for such post exposure bake depends on the blending composition of the composition, the type of additives and the like, and may be ordinarily 30 to 200 degrees C., and preferably 50 to 150 degrees C.

Preferable radioactive ray employed in the exposure process may be EUV radiation of wave length of about 13.5 nm, since such radiation is suitable for forming a micro pattern, and in addition, various types of radioactive ray such as far ultraviolet ray such as argon fluoride (ArF) excimer laser, krypton fluoride (KrF) excimer laser and the like, X-ray such as synchrotron radiation beam and the like, charged particle beams such as electron beam and the like may alternatively be employed.

In the developing operation (c), a pattern is formed by a development with a liquid developer. Typical liquid developer employed for the above-described photoresist coating film includes a basic aqueous solution containing, at a ratio of, for example, 1-10 wt %., a basic compound such as, for example, sodium hydroxide, potassium hydroxide, sodium carbonate, sodium silicate, sodium metasilicate, ammonia, ethylamine, N-propylamine, diethylamine, di-n-propyl amine, triethylamine, methyl diethylamine, dimethylethanolamine, triethanolamine, tetramethylammonium hydroxide, tetraethylammonium hydroxide, choline, pyrrole, piperidine, 1,8-diazabicyclo[5.4.0]-7-undecene, 1,5-diazabicyclo [4.3.0]-5-nonene and the like.

In addition, a water-soluble organic solvent such as, for example, alcohols such as methanol, ethanol and the like, or a surfactant may be suitably added to the above-described liquid developer at a proper amount for the use. In addition to above, when such liquid developer containing a basic aqueous solution is employed, a cleaning with water is generally carried out after the developing process.

The above-described process allows forming a fine pattern smaller than 50 nm. Such process is particularly suitable for forming a pattern fl 1 nm to 32 nm. Therefore, a lithographic process employing such process for forming a pattern is conducted to achieve a production of semiconductor elements with higher integration at higher productivity.

Advantageous effects of the photosensitive composition of the present embodiment will be described as follows. According to the photosensitive composition of the present embodiment, the photoelectron absorbent, which is capable of being excited with photoelectron emitted from the binder resin that absorbs the high energy bean having a wave length of 1 to 300 nm band, is provided in the photoresist material to form the photoresist film containing the photoelectron absorbent in the substrate. This allows photoelectron emitted from the binder resin by an irradiation of the high energy beam excites the photoelectron absorbent, so that secondary electron is emitted. Secondary electron in such case is thermally-equilibrated in a short distance since secondary electron in such case is in the lower energy level, unlikely as in the case of photoelectron in the higher energy level. Therefore, a deterioration in the resolution due to moving of photoelectron for longer distance, which was a problem in the conventional technology, can be reduced. Further, the decreased travelling distance of electron means an increased energy per unit area of the photoresist induced by the irradiation of photoelectron. Therefore, the reaction amount per unit area is increased, achieving highly sensitive photoresist. Thus, the patterned photoresist can be formed with enhanced resolution and sensibility.

When a conventional chemically amplified photoresist is applied in the EUV radiation lithography, problems of resolution, line edge roughness and sensitivity are caused as described below.

In the case that the photoresist is exposed to EUV radiation, energy of single photon is larger than ionization energy of the photoresist material. Therefore, the photoresist reaches to a highly-excited state by the exposure to EUV radiation to be ionized. Photoelectron generated in such ionization process is in a state of higher energy, and thus scatters from the place where EUV radiation is absorbed through the inside of the photoresist, and then is achieved to a thermal-equilibration, and thereafter, excite the photo-acid generator to generate acid. The distance of electron transfer is considered as about 5 nm. In other words, additional travelling of about several nanometer is required for attaining a thermal equilibrium for photoelectron, as compared with the conventional lithography, so that the resolution for the photoresist is reduced, causing a problem of increased roughness on the side wall of the photoresist pattern.

Further, since the energy of photon in the EUV radiation is larger, less photons incident to the photoresist are required to achieve an exposure with the same sensibility as employed for the conventional photoresist. Thus, problems in deficient sensibility are caused, in which the amount of light for the exposure is not sufficient for inducing the reaction similarly as in the case of employing the conventional photoresist.

It is clarified by the present inventor that the above-described problems can be solved by employing the photosensitive composition that contains the photoelectron absorbent, which is capable of being excited with electron generated by the exposure of the photoresist, and more specifically by employing the photosensitive composition containing a gallium compound as the above-described photoelectron absorbent.

Energy of EUV light having a wave length of 13.5 nm is 92 eV and ionization energy of the photoresist material is about 10 eV, so that photoelectron of about 82 eV is emitted. Therefore, it is preferable for the photoelectron absorbent to select a material, which has ionization energy of lower than 82 eV around 82 eV and effectively excites electron of around 82 eV. More specifically, such type of the composition is excited with photoelectron of about 82 eV with enhanced efficiency to emit secondary electron. Secondary electron in such case is thermally-equilibrated in a short distance since secondary electron in such case is in the lower energy level, unlikely as in the case of photoelectron in the higher energy level. Therefore, a blur effect due to traveling of photoelectron for longer distance, which was a problem in the conventional technology, can be reduced to achieve enhanced resolution and decreased roughness on the side wall. Gallium compounds may be employed for such compound. Gallium atom has the larger ionization and excitation cross section for electron of 82 eV by 3.8 times than carbon atom. More specifically, the reactivity of gallium atom is larger by four times than the reactivity of carbon atom, and as a result, a thermal-equilibration is caused with higher efficiency to provide reduced distance of electron traveling within the photoresist from the location where EUV radiation is absorbed.

The decreased traveling distance of electron means an increased energy per unit area of the photoresist induced by the irradiation of electron, and thus the reaction amount per unit area is increased, achieving highly sensitive photoresist.

In addition, the mass extinction coefficient of gallium atom for EUV radiation of 13.5 nm is larger by only about twice than that of carbon atom, and is smaller by 25% than that of oxygen atom. Therefore, smaller absorbance of the resist for EUV radiation can be maintained. Since EUV ray can reach to the deeper part of the resist in the case of smaller absorbance of the resist, the photoresist material exhibiting improved dimensional controllability and having rectangular cross-section after the exposure/development can be designed.

The ratio of the reaction cross-sectional area [$\times 10^{-2}$ nm] for photoelectron of the incidence energy of 82.5 eV with the mass absorption coefficient [$\times 10^4$ cm$^2$/g] at 13.5 nm may be employed to estimate the above-described condition. For example, the ratio of the reaction cross-sectional area [$\times 10^{-2}$ nm] for photoelectron of the incidence energy of 82.5 eV with the mass absorption coefficient [$\times 10^4$ cm$^2$/g] at 13.5 nm is 1.43 for gallium, which is higher than any of ratios of constituent elements of conventional resists: 0.39 for hydrogen, 0.79 for carbon and 0.15 for oxygen.

In addition, in the present embodiment, a component that is capable of being excited with higher efficiency with photoelectron generated by absorbing EUV radiation may be included in the photoresist for EUV. Such photoresist is employed to conduct an exposure of the pattern, a post-exposure heating, a developing and a rinsing to form a pattern. This allows providing improved sensitivity of the photoresist, improved resolution, reduced surface roughness of the side wall and enhanced sensitivity. In particular, improved sensitivity of the photoresist, improved resolution and reduction on the side wall roughness can be achieved in the semiconductor fine processing technology.

While the present invention has been fully described in reference to the preferable embodiments, it should be understood that these are presented for the purpose of illustration only, and other configurations may also be adopted for the present invention. For example, while the above-described embodiment is related to the positive-type photoresist, the present invention may also be applicable in the negative-type photoresist, which exhibits the similar advantageous effects of the present invention as exhibited in the case of the positive-type photoresist, and it is needless to point out that such configuration may also exhibit increased sensitivity, increased resolution and reduced line edge roughness.

Exemplary implementation of the present invention will be specifically described by showing the following examples, and it is apparent that the scope of the invention is not limited to the disclosure of the examples.

EXAMPLES

Example 1

10 g of substituted polyhydroxystyrene, in which 60% of hydrogen (H) in phenolic hydroxy group is substituted with t-butoxycarbonyl group, 1 g of dimethyl diphenyl gallium, 0.2 g of triphenyl sulfonium trifluoromethanesulfonate, and 0.02 g of diaminodiphenyl methane were dissolved in 120 g of methyl 3-methoxy propionate, and then the solvent was filtered with a filter of 0.2 μm to prepare a composition solution (I). The prepared composition solution was applied over the silicon wafer, and then the wafer was baked at 100 degrees C. for two minutes to form a photoresist film having a thickness of 60 nm. A line-and-space pattern was transferred over the formed photoresist film at 10 mJ/cm$^2$ by employing EUV radiation of a wave length of 13.5 nm, and then a post exposure bake was carried out for two minutes at 90 degrees C., and was developed with tetramethylammonium hydroxide aqueous solution for 60 seconds at 23 degrees C., and then was rinsed with water for 30 seconds. It was found in an observation of the patterned photoresist by employing a scanning electron microscope (SEM) that a line-and-space pattern of a stroke width of 30 nm was successfully resolved. The value of 2 nm was obtained in the measurement of the line edge roughness.

Comparative Example 1

The pattern was formed similarly as in Example 1, except that the composition solution (I) employed in Example 1 excluded dimethyl diphenyl gallium and that the different irradiation level of EUV radiation was employed. The result was that the line-and-space pattern of a stroke width of 35 nm was successfully resolved with the irradiation of 20 mJ/cm$^2$, and the line edge roughness was 5 nm.

The results of Example 1 show that better values of the sensitivity, the resolution and the line edge roughness were obtained in Example 1, as compared with that obtained for the photoresist of Comparative Example 1. While higher level of exposure leads to narrower line pattern in the positive-type photoresist, Example 1 showed that smaller line-and-space pattern was successfully resolved even if the exposure level was smaller than in Comparative Example 1. Therefore, it was also found the photoresist pattern was created with higher sensitivity and higher resolution by employing the lithographic technology presented in Example 1. Further, it was also found that the photoresist pattern with reduced line edge roughness was achieved in Example 1, as compared with Comparative Example 1.

In addition, the photoelectron absorbent in the photosensitive composition of Example 1 contained dimethyl diphenyl gallium, so that dimethyl diphenyl gallium was effectively excited with highly energetic photoelectron generated in the photoresist by the exposure to EUV radiation, promptly reducing energy of photoelectron, thereby achieving a thermal-equilibration. Thus, highly energetic photoelectron attains a thermal-equilibration near the location where EUV radiation is absorbed, without traveling in the inside of the photoresist, so that a blur effect due to traveling of photoelectron can be avoided, advantageously achieving higher resolution and reduced line edge roughness.

Further, the traveling distance of highly energetic photoelectron is reduced to provide an enhanced energy per unit length (unit dimensional area) provided by the exposure of the photoresist to EUV radiation. Therefore, the advantageous effect of increased sensitivity of the photoresist can also be achieved.

Example 2

The pattern was formed similarly as in Example 1, except that gallium bromide was employed in the preparation of the composition solution (I) employed in Example 1 in place of dimethyl diphenyl gallium and that the different irradiation level of EUV radiation was employed. The sensitivity was 15 mJ/cm$^2$. It was found in an observation of the patterned photoresist by employing a SEM that the above-described line-and-space pattern of a stroke width of 30 nm was successfully resolved. The value of 3 nm was obtained in the measurement of the line edge roughness.

The results show that respective better values of the sensitivity, the resolution and the line edge roughness were obtained in Example 2, as compared with that obtained in the Comparative Example 1. This manifests that it was found the photoresist pattern was created with higher sensitivity, higher resolution and reduced line edge roughness by employing the lithographic technology presented in Example 2.

Example 3

The pattern was formed similarly as in Example 1, except that gallium chloride-phthalocyanine was employed in the preparation of the composition solution (I) employed in Example 1 in place of dimethyl diphenyl gallium and that the different irradiation level of EUV radiation was employed. The sensitivity was 17 mJ/cm$^2$. It was found in an observation of the patterned photoresist by employing a SEM that the above-described line-and-space pattern of a stroke width of 30 nm was successfully resolved. The value of 2 nm was obtained in the measurement of the line edge roughness.

The results show that respective better values of the sensitivity, the resolution and the line edge roughness were obtained in Example 3, as compared with that obtained in the Comparative Example 1. This manifests that it was found the photoresist pattern was created with higher sensitivity, higher resolution and reduced line edge roughness by employing the lithographic technology presented in Example 3.

Example 4

The pattern was formed similarly as in Example 1, except that triphenyl indium was employed in the preparation of the composition solution (I) employed in Example 1 in place of dimethyl diphenyl gallium and that the different irradiation level of EUV radiation was employed. The sensitivity was 10 mJ/cm$^2$. It was found in an observation of the patterned photoresist by employing a SEM that the above-described line-and-space pattern of a stroke width of 25 nm was successfully resolved. The value of 1 nm was obtained in the measurement of the line edge roughness.

The results show that respective better values of the sensitivity, the resolution and the line edge roughness were obtained in Example 4, as compared with that obtained in the Comparative Example 1. This manifests that it was found the photoresist pattern was created with higher sensitivity, higher resolution and reduced line edge roughness by employing the lithographic technology presented in Example 4.

In addition, the photoelectron absorbent in the photosensitive composition of Example 4 contained triphenyl indium, so that triphenyl indium was effectively excited with highly energetic photoelectron generated in the photoresist by the exposure to EUV radiation, promptly reducing energy of photoelectron, thereby achieving a thermal-equilibration. Thus, highly energetic photoelectron attains a thermal-equilibration near the location where EUV radiation is absorbed, without traveling in the inside of the photoresist, so that a blur effect due to traveling of photoelectron can be avoided, achieving higher resolution and reduced line edge roughness. In addition, indium, which is a heavy atom, achieves reduced flight distance of electron, providing higher resolution.

Example 5

The pattern was formed similarly as in Example 1, except that x-ray of wave length of 0.4 to 1 nm was employed instead of EUV radiation of wave length of 13.5 nm as employed in Example 1. The sensitivity was 20 mJ/cm². It was found in an observation of the patterned photoresist by employing a SEM that the above-described line-and-space pattern of a stroke width of 25 nm was successfully resolved. The value of 5 nm was obtained in the measurement of the line edge roughness.

Comparative Example 2

The pattern was formed similarly as in Example 1, except that the composition solution (I) employed in Example 1 excluded dimethyl diphenyl gallium and that the different irradiation levels of x-ray having a wave length of 0.4 to 1 nm were employed, instead of employing EUV radiation of 13.5 nm. The result was that the line-and-space pattern of a stroke width of 35 nm was successfully resolved with the irradiation of 50 mJ/cm², and the line edge roughness was 7 nm.

The results show that respective better values of the sensitivity, the resolution and the line edge roughness were obtained in Example 5, as compared with that obtained in the Comparative Example 2. This manifests that it was found the photoresist pattern was created with higher sensitivity, higher resolution and reduced line edge roughness by employing the lithographic technology presented in Example 5, in case of employing x-ray having a wave length of 0.4 to 1 nm as a light source.

Example 6

10 g of polyhydroxystyrene, 1 g of dimethyl diphenyl gallium, 0.2 g of triphenyl sulfonium trifluoromethane-sulfonate, 2 g of tetra methoxyl methyl glycol and 0.02 g of diaminodiphenyl methane were dissolved in 120 g of methyl 3-methoxy propionate, and then the solvent was filtered with a filter of 0.2 μm to prepare a composition solution (II). The prepared composition solution (II) was applied over the silicon wafer, and then the wafer was baked at 100 degrees C. for two minutes to form a photoresist film having a thickness of 60 nm. A line-and-space pattern was transferred over the formed resist film at 5 mJ/cm² by employing EUV radiation of a wave length of 13.5 nm, and then a post exposure bake was carried out for one minute at 90 degrees C., and was developed with tetramethylammonium hydroxide aqueous solution for 60 seconds at 23 degrees C., and then was rinsed with water for 30 seconds. It was found in an observation of the patterned photoresist by employing a SEM that a negative-type line pattern of a stroke width of 50 nm was successfully resolved. The value of 7 nm was obtained in the measurement of the line edge roughness.

Comparative Example 3

The pattern was formed similarly as in Example 6, except that the composition solution (II) employed in Example 6 excluded dimethyl diphenyl gallium and that the different irradiation level of EUV radiation having a wave length of 13.5 nm was employed. The result was that the negative-type line pattern of a stroke width of 60 nm was successfully resolved with the irradiation of 10 mJ/cm², and the line edge roughness was 10 nm.

The results of Example 6 show that better values of the sensitivity, the resolution and the line edge roughness were obtained in Example 6, as compared with that obtained in Comparative Example 3. This manifests that it was found the photoresist pattern was created with higher sensitivity, higher resolution and reduced line edge roughness by employing the lithographic technology presented in Example 6.

It is apparent that the present invention is not limited to the above embodiment, and may be modified and changed without departing from the scope and spirit of the invention.

What is claimed is:

1. A photosensitive composition, which is capable of being irradiated with a high energy beam having a wave length of 1 to 100 nm band, said photosensitive composition comprising:
    a binder resin; and
    a photoelectron absorbent, which becomes excited with photoelectron emitted from the binder resin that absorbs the high energy beam, when the binder resin is irradiated with the high energy beam.

2. The photosensitive composition as set forth in claim 1, wherein the photoelectron absorbent comprises a metallic element having a ratio of reaction cross-sectional area [×10⁻² nm] for photoelectron emitted from the binder resin irradiated with extreme ultraviolet (EUV) radiation as the high energy beam, with mass absorption coefficient [×10⁴ cm²/g] for the EUV radiation, of equal to or higher than 0.8.

3. The photosensitive composition as set forth in claim 1, wherein incident energy of photoelectron emitted from the binder resin is 82.5 eV.

4. The photosensitive composition as set forth in claim 1, wherein the photoelectron absorbent comprises gallium.

5. The photosensitive composition as set forth in claim 4, wherein the photoelectron absorbent comprises an inorganic compound comprising gallium, an organometallic compound comprising gallium, or a metallic complex comprising gallium.

6. The photosensitive composition as set forth in claim 1, wherein the photoelectron absorbent comprises indium.

7. The photosensitive composition as set forth in claim 6, wherein the photoelectron absorbent comprises an inorganic compound comprising indium, an organometallic compound comprising indium, or a metallic complex comprising indium.

8. The photosensitive composition as set forth in claim 1, further including a photo-acid generator that generates the acid by the irradiation of the high energy beam.

9. The photosensitive composition as set forth in claim 1, wherein the high energy beam comprises an X-ray or an extreme ultraviolet (EUV) radiation.

10. A method for forming a pattern, said method including:
    forming a photoresist film on a substrate employing a photoresist material comprising the photosensitive composition as set forth in claim 1;
    exposing the photoresist film to the high energy beam having the wave length of 1 to 300 nm band; and
    developing the exposed photoresist film.

11. The method for forming the pattern as set forth in claim 10, wherein the high energy beam comprises an X-ray or an extreme ultraviolet (EUV) radiation.

12. A method for manufacturing a semiconductor element including a lithographic operation, wherein said lithography operation includes:
forming a photoresist film on a substrate employing a photoresist material comprising the photosensitive composition as set forth in claim 1; and
exposing the photoresist film to the high energy beam having the wave length of 1 to 300 nm band.

13. The photosensitive composition as set forth in claim 1, wherein the photosensitive composition is irradiated with the high energy beam having the wave length of 1 to 100 nm band.

14. The photosensitive composition as set forth in claim 1, further comprising:
an acid diffusion-control agent that controls a diffusion of an acid generated by the irradiation of the high energy beam to inhibit unwanted chemical reaction in unexposed regions.

15. The photosensitive composition as set forth in claim 14, wherein the photoelectron absorbent comprises an organogallium compound comprising

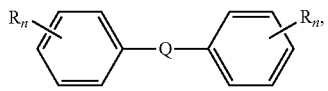

wherein Q comprises hydrocarbon residue comprising gallium, and R comprises fluorine, chlorine, bromine, a saturated hydrocarbon, group, an unsaturated hydrocarbon group, an aromatic hydrocarbon group, a halogenated saturated hydrocarbon group, a halogenated aromatic hydrocarbon group, a halogenated unsaturated hydrocarbon group, or a silicon containing hydrocarbon group.

16. The photosensitive composition as set forth in claim 14, wherein the binder resin comprises an acidic dissociation group bound to a resin that is soluble with an alkali liquid developer.

17. The photosensitive composition as set forth in claim 14, wherein the resin that is soluble with the alkali liquid developer comprises a functional group exhibiting affinity with an alkali liquid developer.

18. The photosensitive composition as set forth in claim 14, wherein the resin that is soluble with the alkali liquid developer comprises one of

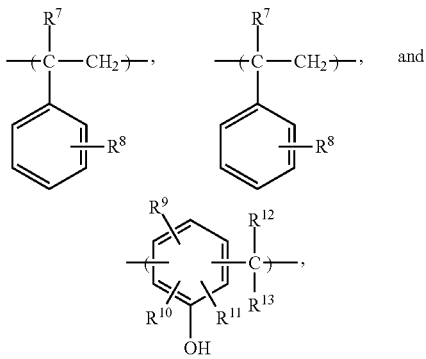

wherein $R^7$ comprises hydrogen or a methyl group, $R^8$ comprises hydroxyl group, carboxyl group, $—R^9COOH$, $—OR^9COOH$, or $—OCOR^9COOH$, in which $R^9$ comprises $—(CH_2)n_1-$ and $n_1$ is an integer number of 1 to 4, and
wherein $R^9, R^{10}, R^{11}, R^{12}$ and $R^{13}$ comprise hydrogen or an alkyl group of C1 to C4.

19. The photosensitive composition as set forth in claim 14, wherein the binder resin comprises an alkali-insoluble resin or an alkali-hardly-soluble resin.

20. The photosensitive composition as set forth in claim 19, wherein an amount of the photo-acid generator is in a range from 10 parts by weight to 20 parts by weight per 100 parts by weight of the binder resin.

* * * * *